United States Patent [19]
Lanclos

[11] Patent Number: 6,144,556
[45] Date of Patent: Nov. 7, 2000

[54] HEAT DISSIPATING HOUSING FOR ELECTRONIC COMPONENTS

[76] Inventor: Kenneth W. Lanclos, 1114 S. Railroad Ave., Opelousas, La. 70570

[21] Appl. No.: 09/281,615

[22] Filed: Mar. 30, 1999

[51] Int. Cl.[7] ................................................ H05K 7/20
[52] U.S. Cl. ................................. 361/695; 361/715
[58] Field of Search .................. 361/688, 690, 361/694–695, 715, 752

[56] References Cited

U.S. PATENT DOCUMENTS

| | | | |
|---|---|---|---|
| 5,440,450 | 8/1995 | Lau et al. ................................. | 361/695 |
| 5,461,541 | 10/1995 | Wentland, Jr. et al. ................. | 361/707 |
| 5,694,294 | 12/1997 | Ohashi et al. ........................... | 361/695 |
| 6,027,535 | 2/2000 | Eberle et al. ............................ | 361/690 |
| 6,046,908 | 4/2000 | Feng ....................................... | 361/707 |

*Primary Examiner*—Gregory Thompson
*Attorney, Agent, or Firm*—Joseph L. Lemoine; Jesse D. Lambert; Greg R. Mier

[57] ABSTRACT

The present invention provides a heat dissipating housing for electronic circuits and associated components, wherein the housing includes a top, two side panels, and a bottom to form a cavity or chamber for installing therein electronic circuit boards and the like. A first end panel and a second end panel, which are attached to opposite ends of the housing, complete the housing enclosure. For superior heat dissipation efficiency, a fan or other air moving device is attached to the housing to move air through the housing. The housing structure and the electronic components positioned therein are configured so as to direct the cooling air in multiple passes through the housing in a serpentine manner before exiting the housing. The multiple pass feature of the present invention provides superior cooling for the electronic components installed inside the housing.

22 Claims, 11 Drawing Sheets

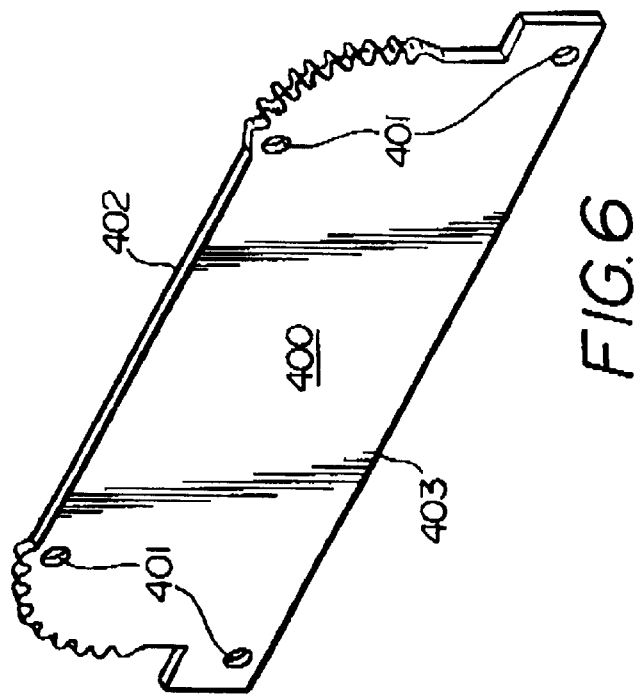
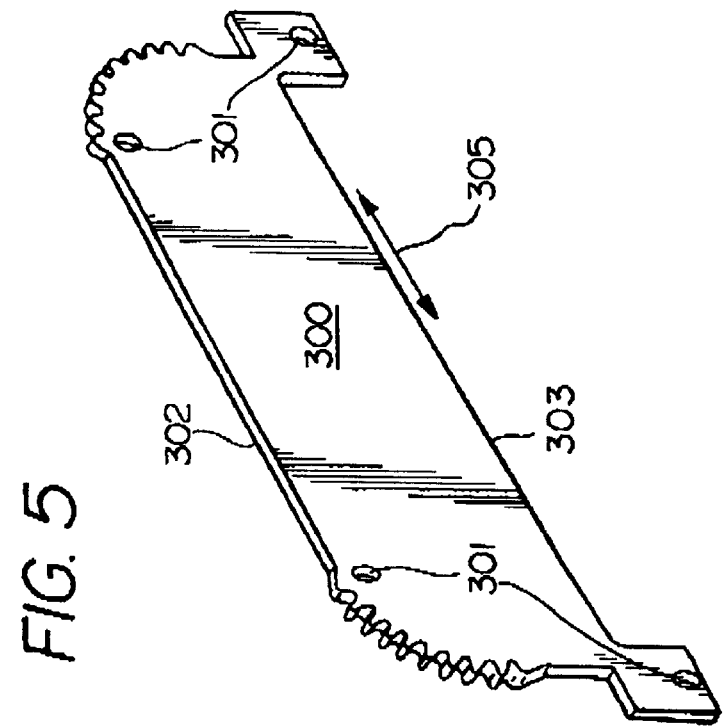

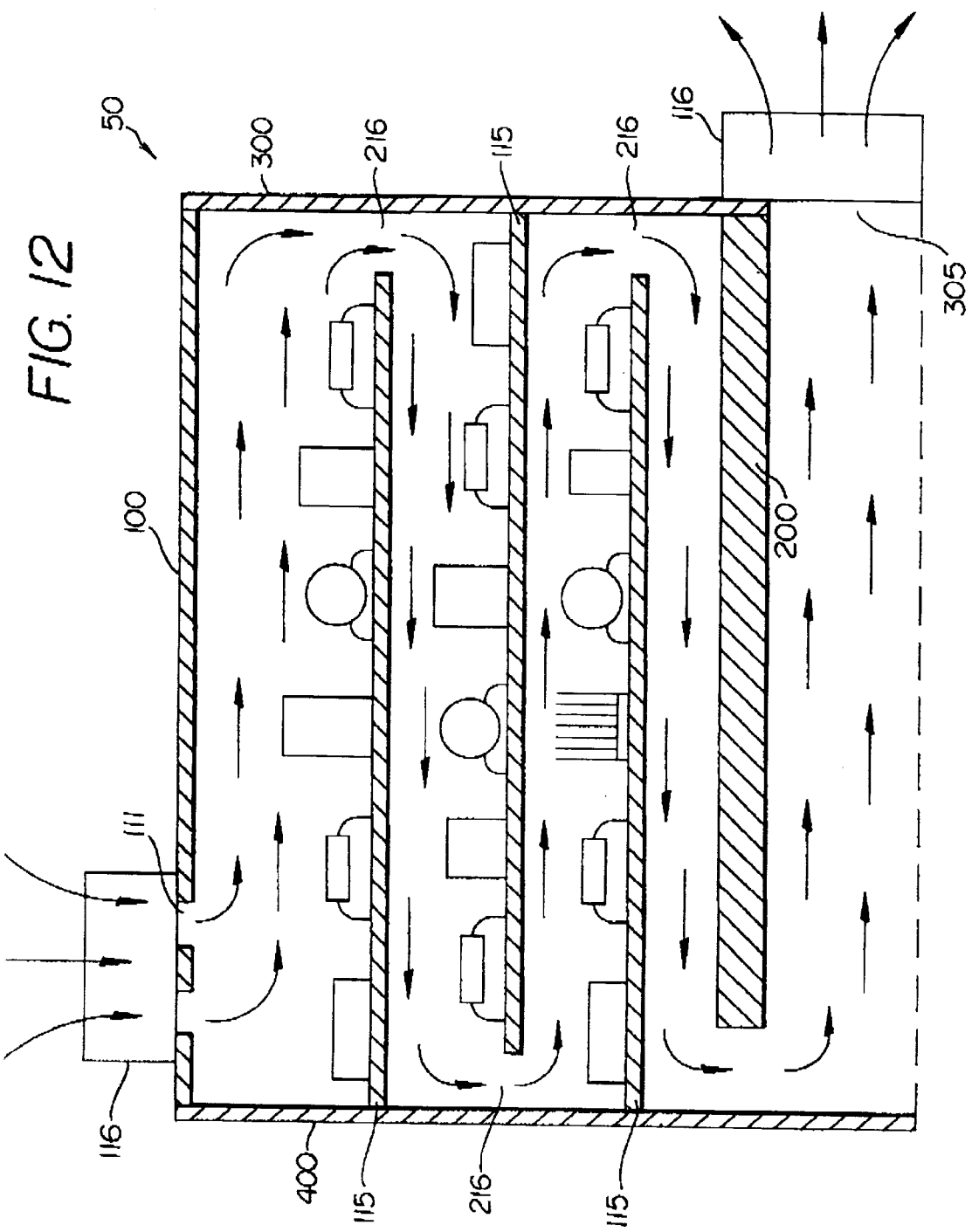

HEAT DISSIPATING HOUSING FOR ELECTRONIC COMPONENTS

BACKGROUND

1. Field of the Invention

The subject invention relates generally to enclosures for heat-generating electrical components. More particularly, it relates to an improved heat-dissipating housing for power amplifiers and the like.

2. Description of the Related Art

The prior art recognizes the use of power or performance amplifiers and the like to modify audio frequency signals generated by a sound system. With such known amplifiers, audiophiles can listen to high-fidelity sound reproductions of music and speech, even in adverse conditions such as inside a moving vehicle or water craft.

In the past, electronic circuit boards, such as those found in power amplifiers, were conventionally mounted on open racks. When installed in such a manner, the electronic boards were exposed to ambient air, dust, humidity, and other conditions which adversely affected the characteristics, performance, and useful lives of the circuit boards and associated components. As a result, inventions were directed at overcoming the disadvantages of these prior mounting methods.

One such invention is disclosed in U.S. Pat. No. 4,656, 559, dated Apr. 7, 1987, to Fathi. The Fathi invention provides a one-piece metal tube with internal grooves to support circuit boards and circuit members, and external ridges to maximize radiation of heat from inside the tube. Fathi also provides two removable cover plates for attaching to the open ends of the tube to form a closed compartment inside the tube. A particularly advantageous feature of the Fathi invention is the relative ease with which the circuit boards and components can be inserted and removed from the grooves inside the tube.

A similar invention is disclosed in U.S. Pat. No. 5,130, 891, dated Jul. 14, 1992, to Christie. The Christie invention presents an amplifier housing assembly which is particularly useful for automobile stereo systems. The housing assembly basically comprises an amplifier enclosure for containing the amplifier components and a mounting plate which bolts to a stationary surface inside the vehicle. The primary advantage of the Christie invention is that the amplifier can be easily removed when in need of servicing.

Another related invention appears in U.S. Pat. No. 5,285, 500, dated Feb. 8, 1994, to Mantz. Mantz discloses an amplifier unit adapted for use in a vehicle which has an opening through which circuitry can be changed inexpensively by a consumer, thereby enabling the basic operating characteristics of the amplifier unit to be modified to suit the consumer's desire.

In still another related invention, U.S. Pat. No. 5,521,792, dated May 28, 1996, to Pleitz, et al. discloses a simplified amplifier housing and mounting system. The Pleitz invention substantially eliminates observable and unfinished screw heads, limits the affects of stray magnetic flux and ground loop noise, minimizes the costs associated with replacing housing and mounting components, and can be manufactured and installed inexpensively.

All of the housings disclosed in the aforementioned inventions are equipped with ridges and valleys which serve to increase the surface area of the particular housing so that the housing operates as an efficient heat sink for the electronic circuits and associated components inside the housing compartment. None of the aforementioned inventions, however, do anything more than increasing the surface area to provide a means for dissipating heat from the electronic circuits and associated components contained inside the housing compartment.

The need to provide additional cooling for the electronic circuits and associated components contained inside a housing compartment, such as those found in the aforementioned inventions, has become increasingly important as typical environments for such housing compartments have changed significantly. For example, in the case of power amplifiers for automobiles, suitable hidden space within an automobile has become less available as more compact automobiles are designed and more existing hidden space is required to house new or improved factory installed option hardware. Where suitable hidden space is not available, add-on automotive equipment, such as a power amplifier, must be located in relatively less suitable locations such as the trunk of the automobile.

One problem with installing a power amplifier in the trunk of an automobile is that the power amplifier is subject to higher temperatures and humidity, which can adversely affect the performance and durability of the electronic circuits and components contained inside the power amplifier housing. Moreover, most consumers would rather not utilize precious trunk space with bulky audio equipment. Therefore, under these and similar circumstances, there exists a need for additional cooling within a limited amount of space to keep the electronic circuits and associated components from overheating.

The cooling problem discussed above is partially addressed in U.S. Pat. No. 5,742,478, dated Apr. 21, 1998, to Wu, et al. Wu discloses a housing for a power converter that dissipates heat from the top of the housing via a heat conductor plate which is connected to the housing. The heat conductor plate allows heat to be quickly and uniformly released from the housing into the surroundings. As in all of the inventions cited above, the housing in Wu is equipped with ridges and valleys which increase the surface area of the housing so as to improve the heat sink efficiency of the housing. The heat dissipation effect is further reinforced by an exhaust fan which draws air into the housing.

The present invention is clearly distinguishable from the Wu invention on several accounts. First, the present invention discloses a fan that not only draws air out of the housing, but also forces air into the housing, whereas, the Wu invention merely discloses an exhaust fan which only draws air into the housing. Second, the present invention is configured so that the cooling air makes several passes within the housing before exiting, thereby decreasing the overall size of the invention for each square inch cooled. The Wu invention does not disclose this feature. Other distinguishing features of the present invention over the Wu invention and the remainder of the prior art will be apparent to those skilled in the art after review of the following description of the preferred embodiments.

OBJECTS OF THE INVENTION

A principle object of the present invention is to provide a housing for electronic circuits and associated components which is configured so that effective cooling of the circuits and components contained inside the housing is accomplished within a reasonably sized housing.

Another object of the present invention is to provide a housing for electronic circuits and associated components which is configured to cool the circuits and components contained inside the housing by forcing cooling air through the housing in multiple passes in a serpentine manner before it exits the housing.

Another object of the present invention is to provide an efficient heat dissipating housing for electronic circuits and associated components which is adaptable for installation in hot and humid environments with limited space, such as the trunk of an automobile.

Further objects of the present invention will be readily apparent to those skilled in the art when the following description of the preferred embodiments is read in conjunction with the accompanying drawings.

BRIEF DESCRIPTION OF THE DRAWINGS

The invention will be better understood by reference to the accompanying drawings wherein:

FIG. 5 is a perspective view of the first end panel of the present invention.

FIG. 6 is a perspective view of the second end panel of the present invention.

FIG. 12 is a side, cut-away view of the present invention, showing two fans directing air flow through the housing in a serpentine path.

SUMMARY OF THE INVENTION

The present invention provides a heat dissipating housing for electronic circuits and associated components. The housing includes a top and oppositely facing first and second side panels which extend downwardly therefrom. The housing further includes a bottom, which when combined with the top and two side panels, forms a cavity or chamber for installing therein electronic circuit boards and the like. A first end panel and a second end panel are attached to opposite ends of the housing to complete the housing enclosure.

The inner and outer surfaces of the housing preferably have corrugated cooling fins to increase the surface area and heat dissipation efficiency and capability of the present invention. For additional heat dissipation efficiency and capability, a fan or similar type device is attached to the housing to move air therethrough. The housing structure and the electronic circuits and components installed therein are configured so as to direct the air in multiple passes through the housing in a serpentine manner. The multiple pass feature provides superior cooling for the electronic circuits and components installed inside the housing.

DESCRIPTION OF THE INVENTION

The Preferred Embodiment

While the present invention will be described with reference to preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the present invention not be limited to the particular embodiments disclosed as the best mode contemplated for carrying out this invention, but that the invention will include all embodiments (and legal equivalents thereof) falling within the scope of the appended claims.

Figure 1:
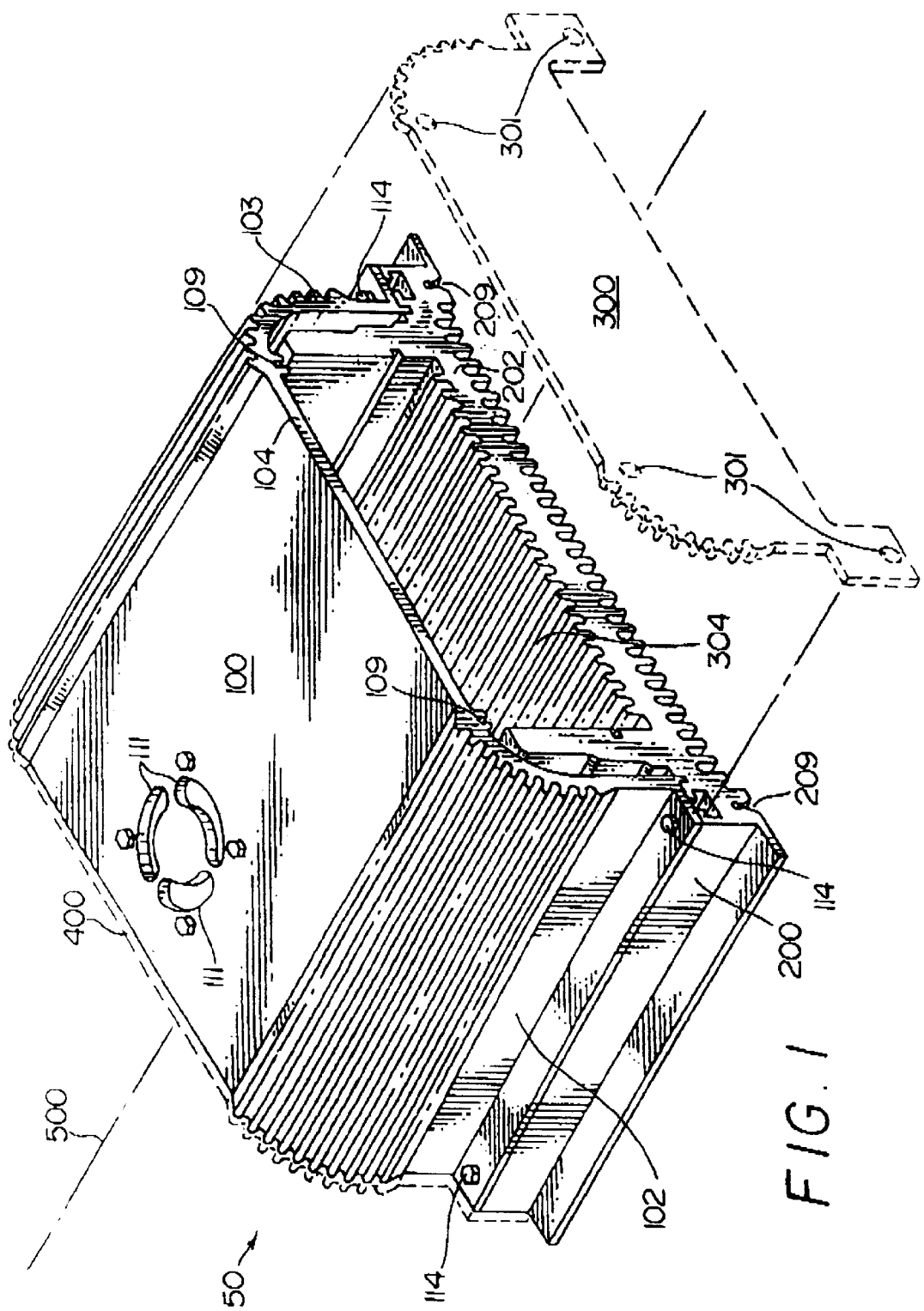
FIG. 1 is a front perspective view of the present invention.
Figure 2:
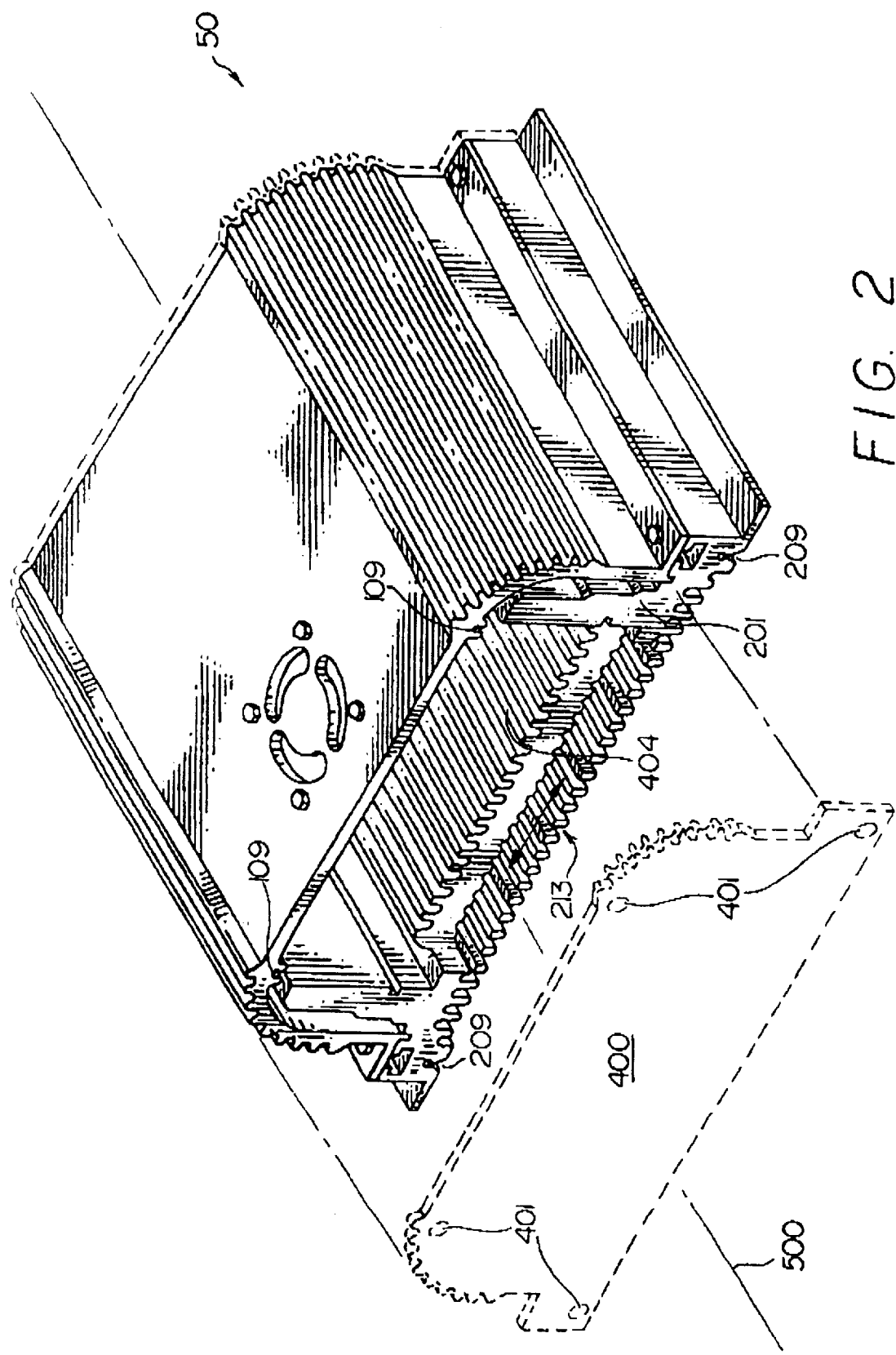
FIG. 2 is a rear perspective view of the present invention.

FIG. 1 is a front perspective view of the preferred embodiment of housing 50 of the present invention. FIG. 2 is a rear perspective view of housing 50. Referring to FIG. 1, housing 50 basically includes a top 100, a first side panel 102, a second side panel 103, a bottom 200, a first end panel 300, a second end panel 400, and an axis 500. Typically, the aforementioned housing parts can be manufactured from a material having a high degree of heat conductivity, such as aluminum. Furthermore, the aforementioned parts can be manufactured as separate and distinct parts, or can be manufactured in various combinations thereof as illustrated in FIGS. 1 and 2, where top 100 and first and second side panels 102 and 103 are shown as one piece.

Figure 3:
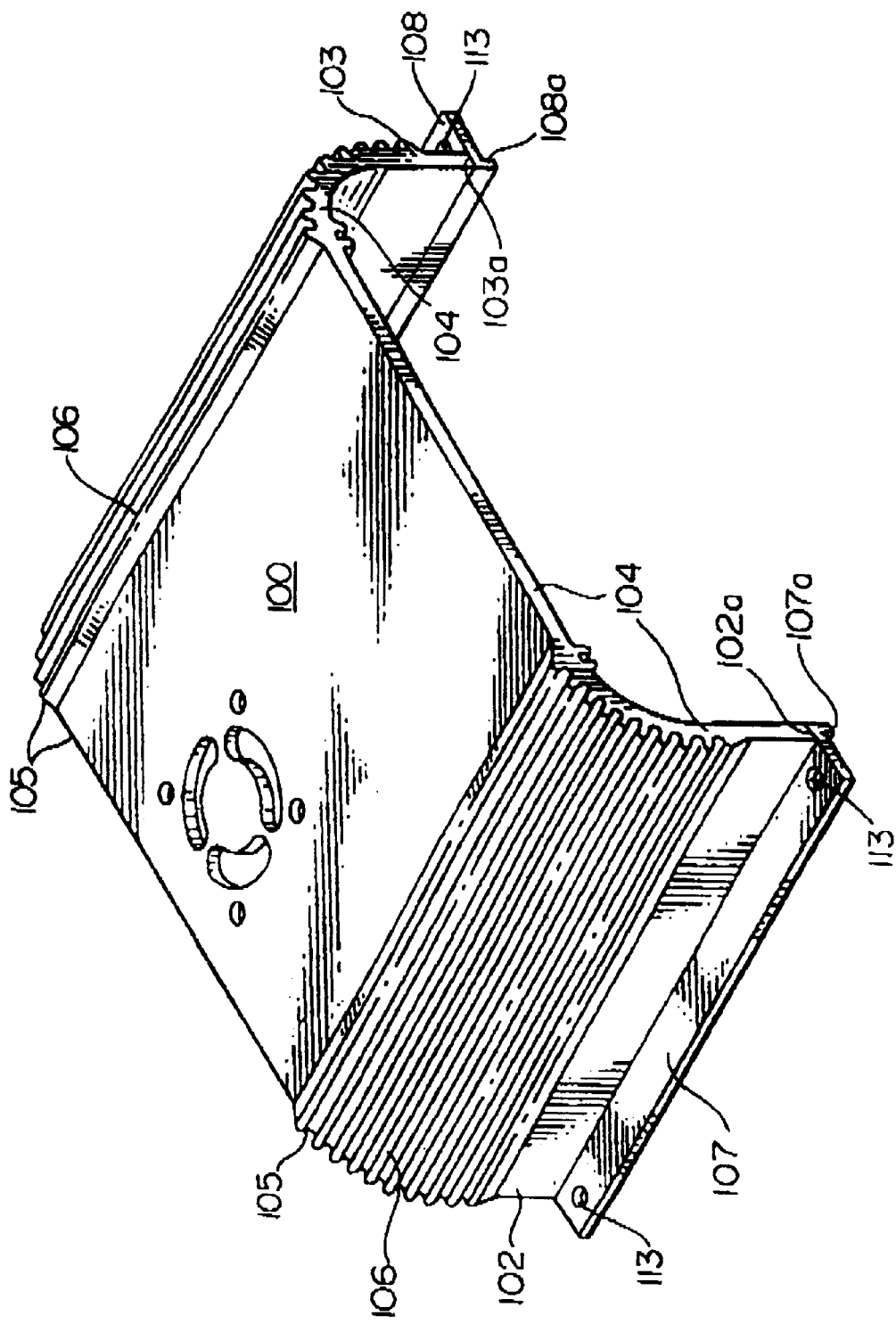
FIG. 3 is a front perspective view of the top and lateral sides of the present invention.

FIG. 3 is a perspective view of top 100 in combination with first and second side panels 102 and 103. As is well known in the art, surfaces 106 of top 100 and first and second side panels 102 and 103 can have corrugated cooling fins parallel with axis 500 to increase the external and/or internal surface area of these parts for improved heat dissipation efficiency.

In the particular embodiment shown in FIG. 3, first and second side panels 102 and 103 preferably extend downwardly from opposite sides of top 100 to form a contiguous front edge 104 and a contiguous back edge 105. First side panel 102 and second side panel 103 each have a bottom edge 102a and 103a, respectively. Bottom edge 102a of first side panel 102 is preferably equipped with a first connector plate 107 for removably connecting first side panel 102 to bottom 200 or to any surface upon which housing 50 may be mounted. Likewise, bottom edge 103a of second side panel 103 is preferably equipped with a second connector plate 108 which serves to removably secure second side panel 103 to bottom 200 or to any surface upon which housing 50 may be mounted. First and second connector plates 107 and 108 provide a relatively flat surface so that holes 113 can be punched or drilled therethrough for receiving screws or bolts 114 for use in connecting top 100 to bottom 200 or to a mounting surface.

First and second connector plates 107 and 108 may also be equipped with ridges 107a and 108a, which typically extend the entire length of connector plates 107 and 108, respectively. Ridges 107a and 108a preferably fit into lateral grooves 214, as explained hereinbelow, and serve to align top 100 in the proper position over bottom 200.

Figure 4:
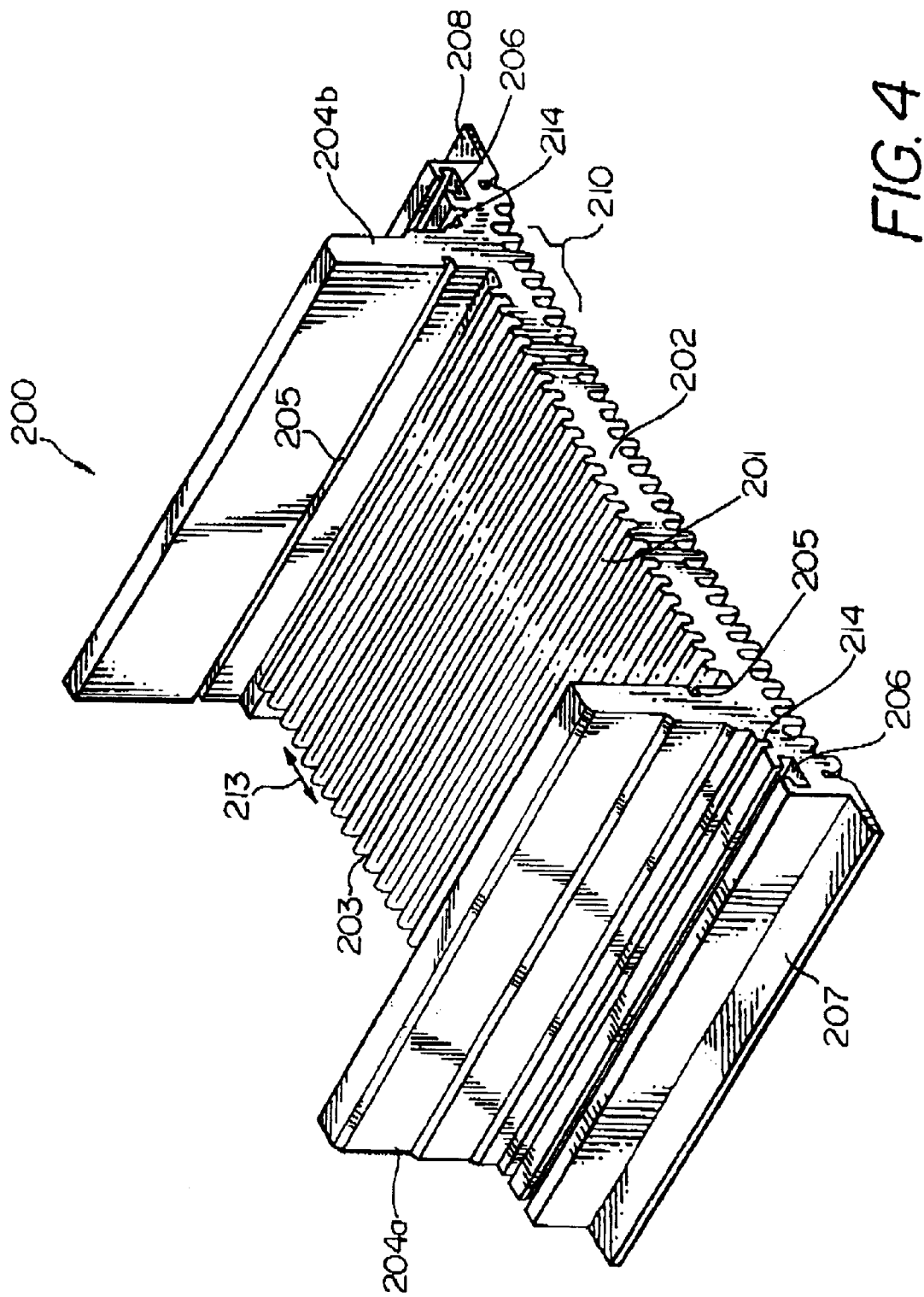
FIG. 4 is a front perspective view of the bottom of the present invention.

Referring now to FIG. 4, bottom 200 includes a base 201, a front edge 202, and a back edge 203. Bottom 200 may also include two lateral heat transmission walls 204a and 204b, which extend upwardly from base 201. Similar to top 100 and first and second side panels 102 and 103, base 201 may have surfaces 210 equipped with corrugated cooling fins parallel to axis 500 to increase the internal and/or external surface area of bottom 200 for improved heat dissipation efficiency and capacity.

When bottom 200 is properly connected to top 100 and first and second side panels 102 and 103, the space between top 100, side panels 102 and 103, and base 201 defines a housing area for installing electronic circuits and associated components. Front edge 202 should be substantially aligned with front edge 104 of top 100 to define an opening 304, as shown in FIG. 1. Similarly, back edge 203 of bottom 200 should be substantially aligned with back edge 105 of top 100 to define an opening 404 through which electronic components and the like can move in and out of housing 50, as shown in FIG. 2. However, a portion of base 201 is preferably offset along back edge 203 to provide a port 213, which allows cooling air to enter or exit housing 50 between back edge 203 and second end panel 400, as is explained hereinbelow.

Still referring to FIG. 4, base 201 typically includes T-slots 206 which extend from front edge 202 to back edge 203. T-slots 206 are designed to help secure first and second side panels 102 and 103 to bottom 200 when a bolt and nut 114 or similar type connecting device is used. When a bolt and nut are employed, the head of an appropriately sized bolt is slid into T-slot 206 with the threaded portion of the bolt pointing upwards. The body of the bolt is slid through a hole 113 in first connector plate 107 or second connector plate 108. The nut is finally screwed onto the threaded portion of the bolt until top 100 is tightly secured to bottom 200, as shown in FIGS. 1 and 2. T-slots 206 serve to anchor the head of the bolt while the nut is being tightened thereto.

Base 201 may also be equipped with lateral grooves 214, which are preferably adjacent to T-slots 206 and extend from front edge 202 to back edge 203. Lateral grooves 214 are designed to receive ridges 107a and 108a of first and second side panels 102 and 103 to help maintain proper alignment between top 100 and bottom 200.

Figure 9:
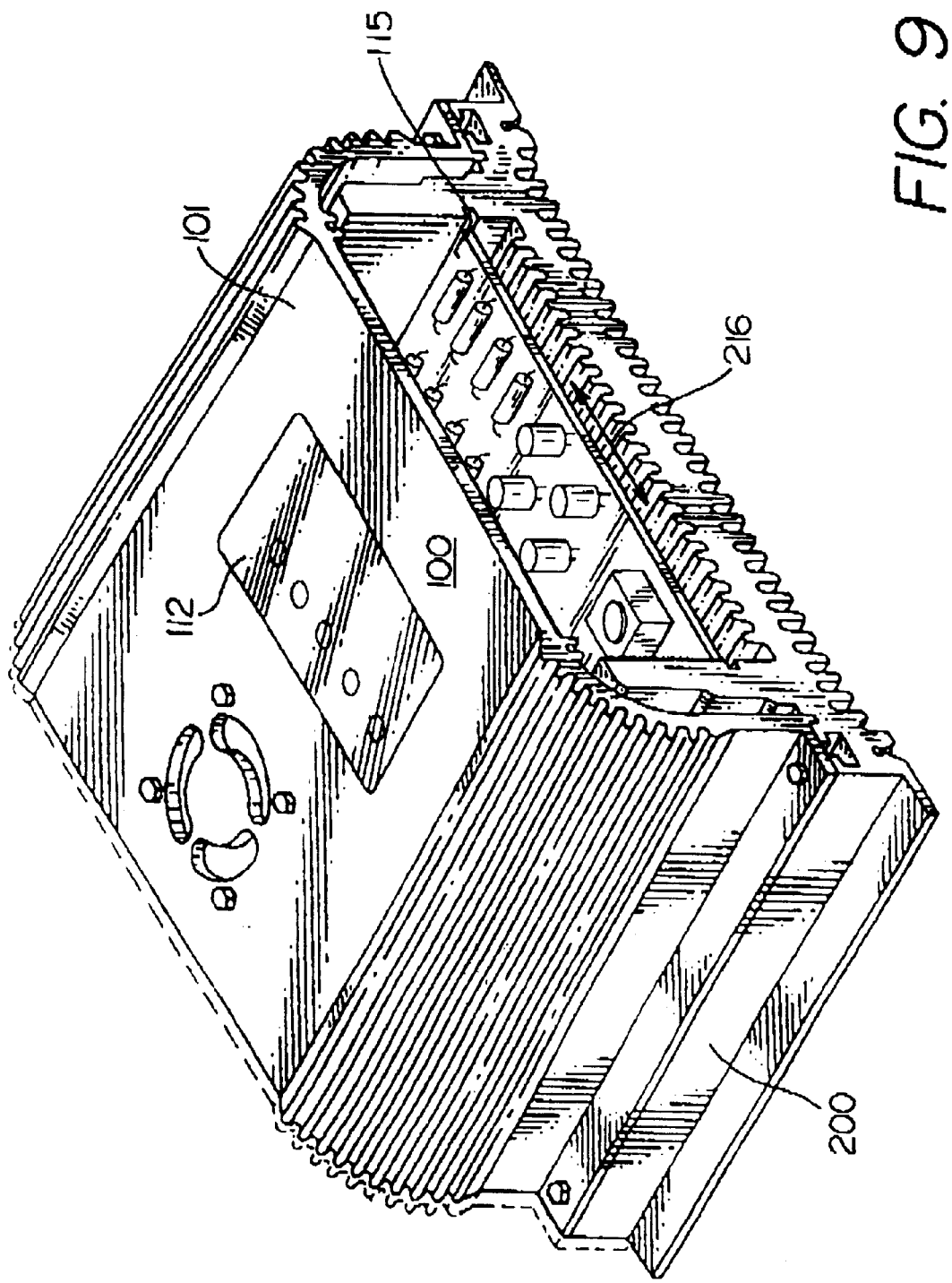
FIG. 9 is a perspective view of the present invention, showing a circuit board and associated components installed inside the housing.

In the preferred embodiment, lateral heat transmission walls 204a and 204b protrude upward from base 201 and extend from front edge 202 to back edge 203. The primary purpose of lateral heat transmission walls 204a and 204b is to provide a heat sink for the electronic circuits and components and other heat generating equipment installed within housing 50. Another purpose of lateral heat transmission walls 204a and 204b is to provide structural support for various circuit boards 115 installed within housing 50, as shown in FIG. 9. It should be noted that first and second side panels 102 and 103 can also provide support for various circuit boards 115, if desired.

Circuit board slots 205 facilitate installation of various circuit boards 115 inside housing 50. Circuit board slots 205 preferably extend from back edge 203 to front edge 202 of bottom 200 and can be oppositely facing on lateral heat transmission walls 204a and 205a, as shown in FIG. 4, or can be oppositely facing on first and second side panels (not shown).

Figure 11:
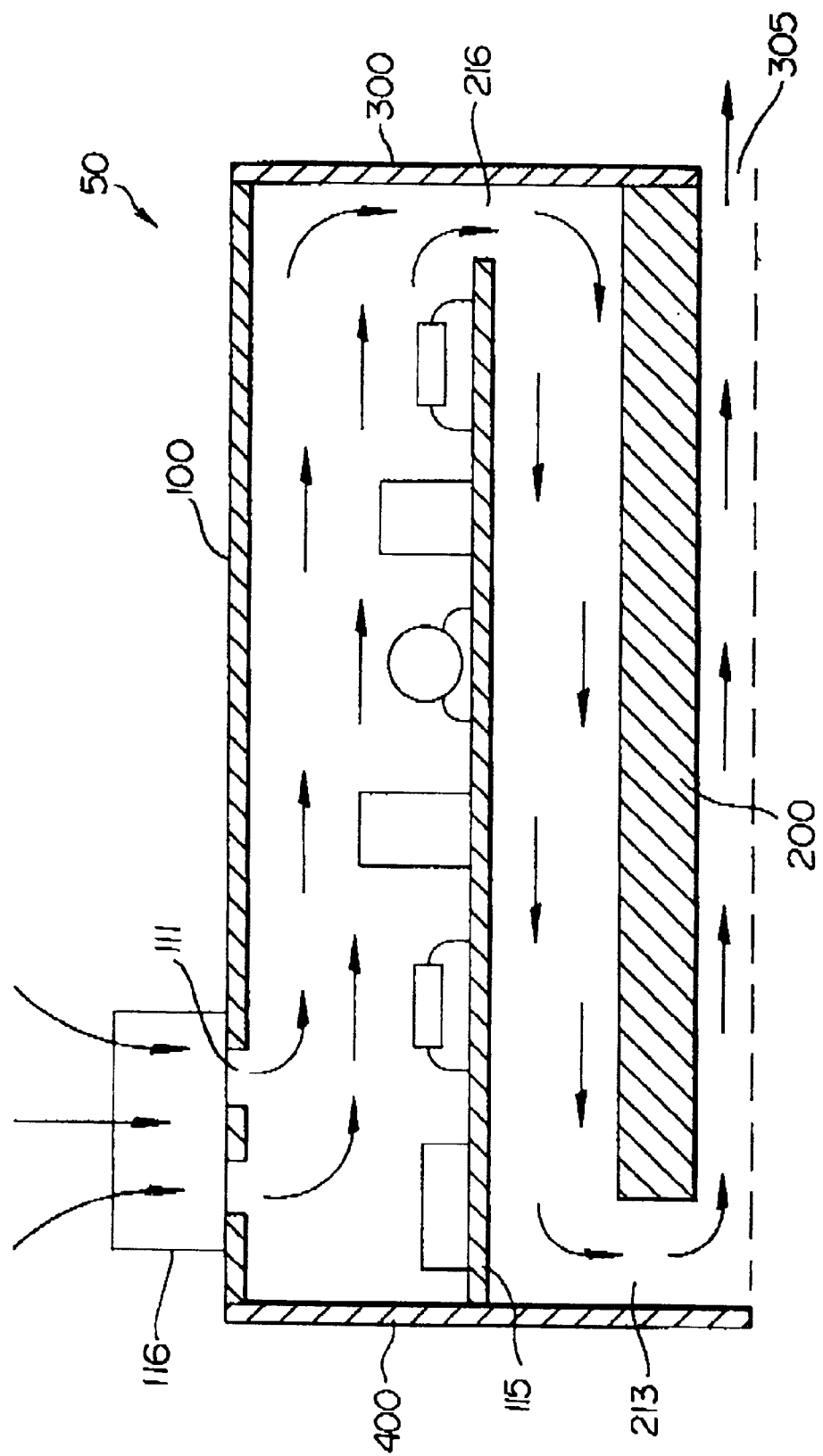
FIG. 11 is a side, cut-away view of the present invention, showing the air flowing through the housing in a serpentine path.

Circuit boards 115 are installed within circuit board slots 205 so that an aperture 216 exists between circuit board 115 and either first end panel 300 or second end panel 400, depending on the number of circuit boards 115 installed within housing 50. In the preferred embodiment, where only one circuit board 115 is installed inside housing 50, aperture 216 is proximate first end panel 300. When more than one circuit board 115 is installed inside housing 50, aperture 216 associated with each circuit board 115 installed above the lowest circuit board is proximate to the end of housing 50 which is opposite aperture 216 of the circuit board 215 adjacently therebelow, as shown in FIG. 12. Aperture 216 is a feature of the present invention which allows cooling air to flow in a serpentine path through housing 50, as shown in FIGS. 11 and 12, thereby providing superior cooling of electronic circuits and associated components contained within a reasonably sized package.

Still referring to FIG. 4, bottom 200 can be further equipped with first anchor plate 207 and second anchor plate 208 to provide an alternate method for installing housing 50 on a mounting surface. First and second anchor plates 207 and 208 preferably extend from front edge 202 to back edge 203 and provide a relatively flat surface for punching or drilling holes 215 therethrough to receive screws or bolts (not shown) used to install housing 50.

Referring back to FIG. 1, first end panel 300 can be secured to front edge 104 and front edge 202 to provide a protective cover for opening 304. First end panel 300 can be installed by inserting screws through pre-punched holes 301 into screw holes 109 and 209, which screw holes are disposed through front edge 104 and through front edge 202, respectively. As is known in the art, first end panel 300 can be attached to front edge 104 and front edge 202 by the process of soldering, welding, or any other suitable method.

Now referring to FIG. 5, first end panel 300 has a top edge 302 that preferably conforms to fit front edge 104. First end panel 300 also has a bottom edge 303 that preferably conforms to fit front edge 202, except to leave a port 305 between bottom edge 303 and the surface upon which housing 50 is installed to allow cooling air to flow under bottom edge 303. This feature of the present invention allows the cooling air to enter or exit housing 50 through port 305. First end panel 300 can also include a number of openings for connecting and installing electrical wiring, RCA jacks, terminal blocks, control knobs and switches, and the like, as shown in FIG. 7.

Similar to first end panel 300, second end panel 400 provides a protective cover for opening 404. Second end panel 400 can be secured to back edge 105 and back edge 203 by inserting screws (not shown) through pre-punched holes 401 into screw holes 109 and 209, as shown in FIG. 2. As is known in the art, second end panel 400 can be attached to back edge 105 and back edge 203 by the process of soldering, welding, or any other suitable method.

Figure 8:
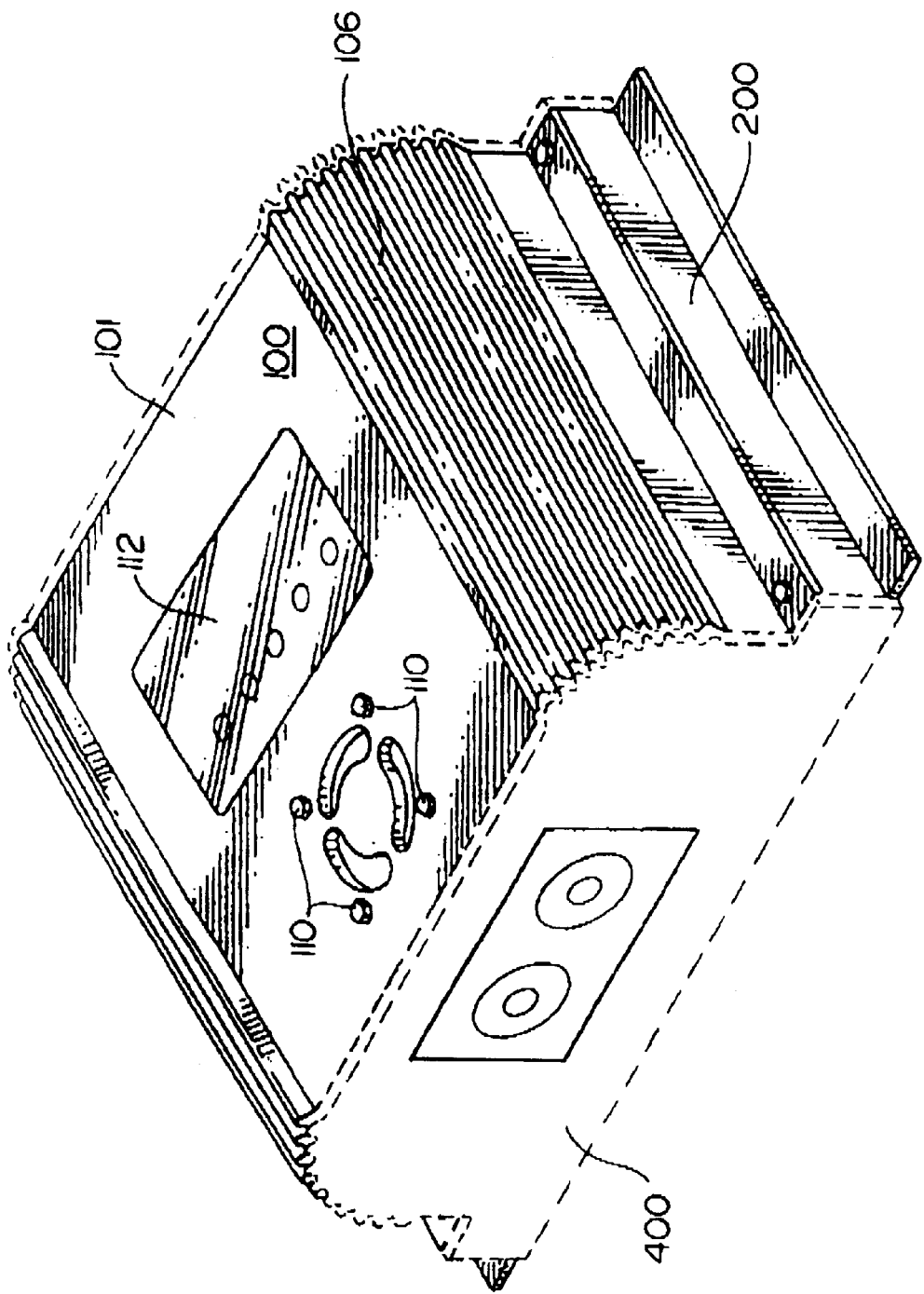
FIG. 8 is a perspective view of the present invention, showing RCA jacks installed in the second end panel and an LED window disposed in the top.

Referring to FIG. 6, second end panel 400 has a top edge 402 that preferably conforms to fit back edge 105 and has a bottom edge 403 that preferably conforms to fit back edge 203. Unlike bottom edge 303 of first end panel 300, bottom edge 403 does not provide a port between bottom edge 403 and the surface upon which housing 50 is mounted. Instead, bottom edge 403 is preferably designed to fit snugly to the surface upon which housing 50 is mounted to prevent the cooling air from flowing under bottom edge 403. Like first end panel 300, however, second end panel 400 can include any number of openings for connecting and installing electrical wiring, RCA jacks, terminal blocks, control knobs and switches, and the like, as shown in FIG. 8.

Figure 7:
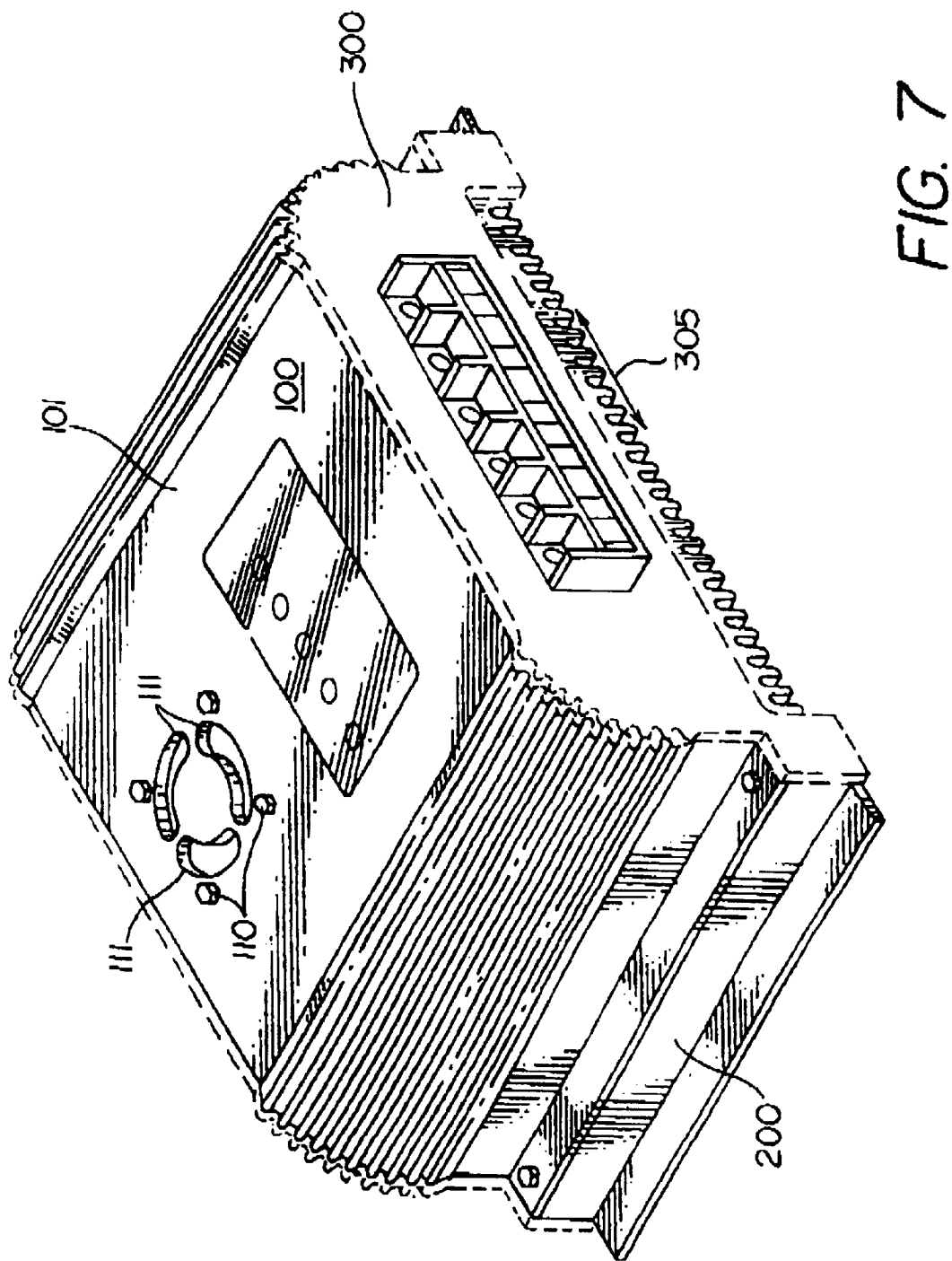
FIG. 7 is a front perspective view of the present invention, showing terminal blocks installed in the first end panel and a means for directing a cooling air into the housing.

Referring now to FIG. 7, top 100 is equipped with ports 111, which are preferably proximate to second end panel 400, for allowing the passage of cooling air into or out of housing 50. The cooling air can be moved into or out of housing 50 by any suitable means, including but not limited to a fan 116, a blower, a vent hose connected to an automobile air conditioner, a vent hose that obtains a draft from outside the automobile as it moves, or the like. Screw holes 110 are shown in FIG. 7 as an example of how to attach top 100 to the means for moving the cooling air into or out of housing 50.

Top 100 can also be equipped with an LED window 112 for monitoring the output of various components installed inside housing 50. LED window 112 can be any size that fits within the boundaries of top 100. LED window 112 can be clear or shaded, and it can be constructed of glass, plexiglass, or any other transparent material.

OPERATION OF THE INVENTION

Before operating the present invention, housing 50 should be pieced together as described above and then installed at the desired location. For the purpose of this illustration, it will be assumed that one circuit board is installed inside housing 50, although it should be understood that the present invention is not limited to one circuit board. Also, it will be assumed that the fan 116 attached to housing 50 is blowing air into the housing, as shown in FIG. 11, as opposed to drawing air therethrough, as shown in FIG. 12. As the cooling air enters housing 50, it flows over the top of circuit board 115 toward first end panel 300. When the cooling air reaches first end panel 300, it is directed downwardly through aperture 216. The cooling air then flows underneath circuit board 115 toward second end panel 400, thereby completing a second pass for further cooling of circuit board 115. Upon reaching second end panel 400, the cooling air is directed through port 213 of base 201. The cooling air then makes a third pass underneath housing 50 toward first end panel 300 before exiting through port 305 to provide further cooling along corrugated surface 210 of bottom 200. In effect, the cooling air makes three passes over the components and surfaces associated with housing 50. The end result is a housing for electronic circuits and associated components with cooling capabilities far superior than that found in the prior art.

Figure 10:
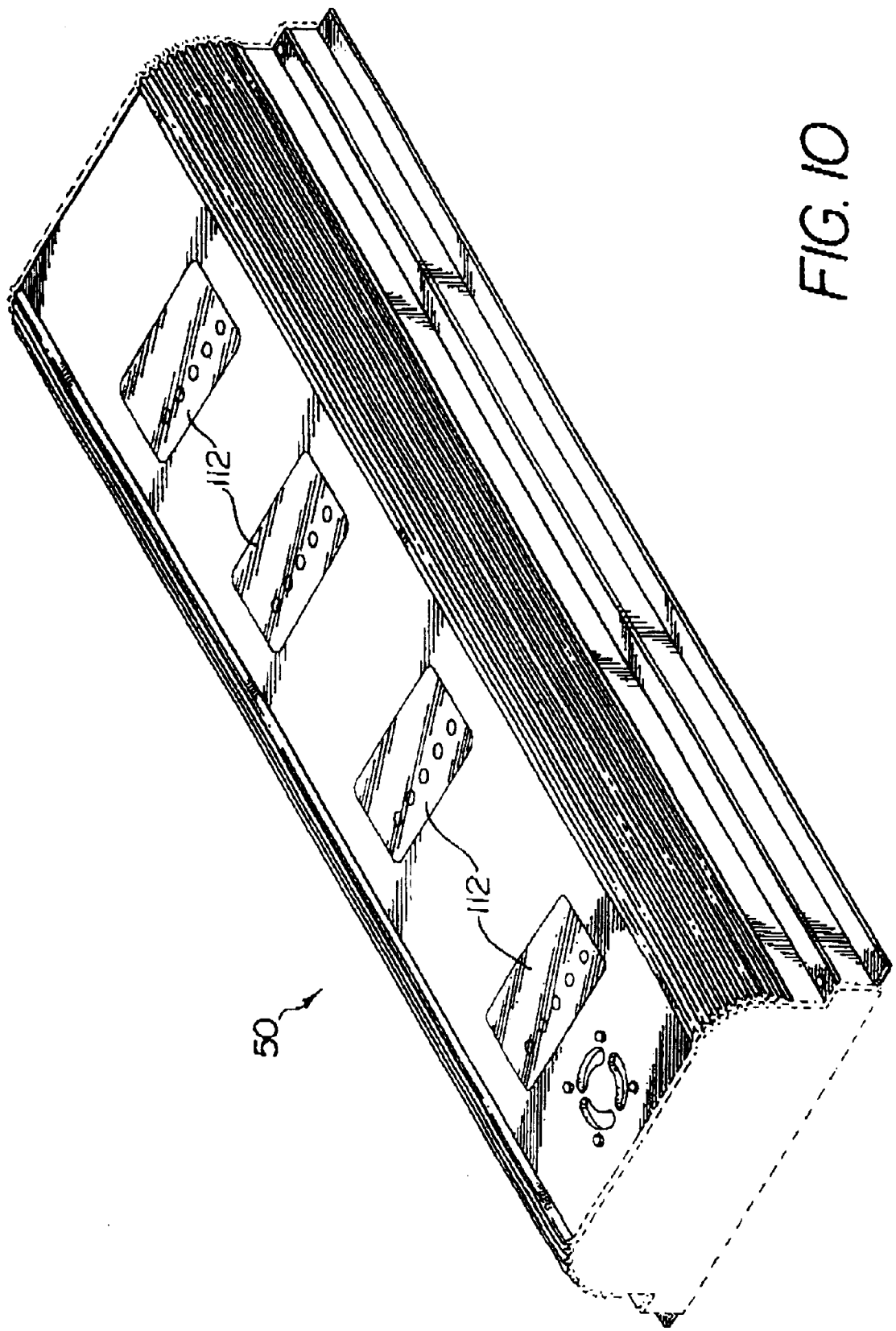
FIG. 10 is a perspective view of an alternative embodiment of the present invention, showing an elongated version.

While the above description contains many specificities, these should not be construed as limitations on the scope of the invention, but rather as an exemplification of one preferred embodiment thereof. Other embodiments can include that which is depicted in FIG. 10, where housing 50 is elongated to accommodate longer circuit boards 115 and multiple LED windows 112. Other dimensions of housing 50 may also be increased or decreased depending on the particular application. Accordingly, the scope of the present invention should be determined not by the embodiment(s) illustrated, but by the appended claims and their legal equivalents.

What is claimed is:

1. A heat dissipating housing for cooling heat generating electronic components, comprising:
    (a) a top, a bottom, a first end panel, a second end panel, first and second side panels, and an axis extending between said first end panel and said second end panel;
    (b) a first circuit board disposed adjacently above said bottom, said first circuit board having heat generating electronic components disposed intermediate and generally parallel to said top and said bottom;
    (c) said first end panel having a first port which permits the passage of air therethrough, where said first port is disposed in said first end panel below said bottom;
    (d) said bottom having a second port which permits the passage of air therethrough, where said second port is disposed in said bottom proximate said second end panel;
    (e) said first circuit board extending from said second end panel to a point proximate said first end panel thereby forming a first aperture proximate to said first end panel which permits the passage of air therethrough;
    (f) at least one subsequent circuit board disposed above said first circuit board, where said at least one subsequent circuit board extends from one said end panel to a point proximate an opposite end panel thereby forming an at least one subsequent aperture proximate to said opposite end panel which permits the passage of air therethrough, where said at least one subsequent aperture is disposed proximate to an end panel which is opposite to said aperture associated with said circuit board adjacently below;
    (g) said top having a third port permitting the passage of air therethrough, where said third port is proximate said end panel which is opposite to said aperture associated with said circuit board adjacently below said top, thereby causing air to wind through said ports and apertures of said housing along said axis from end to end in a serpentine path.

2. The heat dissipating housing of claim 1, further comprising a fan which forces air external to the housing into said housing through said third port of said top.

3. The heat dissipating housing of claim 1, further comprising a fan which forces air internal to the housing therefrom through said third port of said top.

4. The heat dissipating housing of claim 1, further comprising a fan which forces air internal to the housing therefrom through said first port of said first end panel.

5. The heat dissipating housing of claim 1, further comprising a fan which forces air external to the housing into said housing through said first port of said first end panel.

6. The heat dissipating housing of claim 1, further comprising a first fan which forces air external to the housing into said housing through said first port of said top and a second fan which forces air internal to the housing therefrom through said first port of said first end panel.

7. The heat dissipating housing of claim 1, further comprising a first fan which forces air eternal to the housing into said housing through said first port of said first end panel and a second fan which forces air internal to the housing therefrom through said third port of said top.

8. The heat dissipating housing of claim 1, wherein said top, bottom, first side panel and second side panel are comprised of material having a high coefficient of thermal conductivity.

9. The heat dissipating housing of claim 1, wherein said housing has external surfaces comprising cooling fins disposed generally parallel to said axis of said housing.

10. The heat dissipating housing of claim 1, wherein said housing has internal surfaces comprising cooling fins disposed generally parallel to said axis of said housing.

11. The heat dissipating housing of claim 1, wherein said housing has internal and external surfaces comprising cooling fins disposed generally parallel to said axis of said housing.

12. A heat dissipating housing for cooling heat generating electronic components, comprising:
    (a) a top, a bottom, a first end panel, a second end panel, first and second side panels, and an axis extending between said first end panel and said second end panel;
    (b) a generally rectangular circuit board disposed intermediate and generally parallel to said top and said bottom, said circuit board having heat generating electronic components disposed thereon;
    (c) said first end panel having a first port which permits the passage of air therethrough, where said first port is disposed in said first end panel below said bottom;

(d) said bottom having a second port which permits the passage of air therethrough, where said second port is disposed in said bottom proximate said second end panel;

(e) said circuit board extending from said second end panel to a point proximate said first end panel thereby forming an aperture which permits the passage of air therethrough;

(f) said top having a third port proximate said second end panel permitting the passage of air therethrough, thereby causing air to wind through said ports and aperture of said housing along said axis from end to end in a serpentine path.

13. The heat dissipating housing of claim 12, further comprising a fan which forces air external to the housing into said housing through said third port of said top.

14. The heat dissipating housing of claim 12, further comprising a fan which forces air internal to the housing therefrom through said third port of said top.

15. The heat dissipating housing of claim 12, further comprising a fan which forces air internal to the housing therefrom through said first port of said first end panel.

16. The heat dissipating housing of claim 12, further comprising a fan which forces air external to the housing into said housing through said first port of said first end panel.

17. The heat dissipating housing of claim 12, further comprising a first fan which forces air external to the housing into said housing through said third port of said top and a second fan which forces air internal to the housing therefrom through said first port of said first end panel.

18. The heat dissipating housing of claim 12, further comprising a first fan which forces air external to the housing into said housing through said first port of said first end panel and a second fan which forces air internal to the housing therefrom through said third port of said top.

19. The heat dissipating housing of claim 12, wherein said top, bottom, first side panel and second side panel are comprised of material having a high coefficient of thermal conductivity.

20. The heat dissipating housing of claim 12, wherein said housing has external surfaces comprising cooling fins disposed generally parallel to said axis of said housing.

21. The heat dissipating housing of claim 12, wherein said housing has internal surfaces comprising cooling fins disposed generally parallel to said axis of said housing.

22. The heat dissipating housing of claim 12, wherein said housing has internal and external surfaces comprising cooling fins disposed generally parallel to said axis of said housing.

* * * * *